(12) United States Patent
Zhao et al.

(10) Patent No.: US 11,088,184 B2
(45) Date of Patent: Aug. 10, 2021

(54) ARRAY SUBSTRATE AND METHOD OF MANUFACTURING THE SAME

(71) Applicants: BOE TECHNOLOGY GROUP CO., LTD., Beijing (CN); Hefei BOE Optoelectronics Technology Co., Ltd., Anhui (CN)

(72) Inventors: Na Zhao, Beijing (CN); Xufei Xu, Beijing (CN); Ru Zhou, Beijing (CN); Yue Shi, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 722 days.

(21) Appl. No.: 15/764,341

(22) PCT Filed: Sep. 15, 2017

(86) PCT No.: PCT/CN2017/101906
§ 371 (c)(1),
(2) Date: Mar. 29, 2018

(87) PCT Pub. No.: WO2018/141156
PCT Pub. Date: Aug. 9, 2018

(65) Prior Publication Data
US 2020/0266220 A1   Aug. 20, 2020

(30) Foreign Application Priority Data

Feb. 4, 2017 (CN) .......................... 201710064612.0

(51) Int. Cl.
*H01L 27/12* (2006.01)
*G02F 1/1343* (2006.01)
(Continued)

(52) U.S. Cl.
CPC ........ *H01L 27/1288* (2013.01); *G02F 1/1368* (2013.01); *G02F 1/13439* (2013.01);
(Continued)

(58) Field of Classification Search
CPC ............. H01L 27/1288; G02F 1/13439; G02F 1/136209; G02F 1/136227; G02F 1/1368; G02F 1/136222; G03F 7/0035
(Continued)

(56) References Cited

U.S. PATENT DOCUMENTS

| 8,350,994 B1 | 1/2013 | Kim | |
|---|---|---|---|
| 2005/0243235 A1* | 11/2005 | Lee | ...................... G02F 1/13394 349/44 |
| 2019/0219865 A1* | 7/2019 | Yu | .......................... G02F 1/1368 |

FOREIGN PATENT DOCUMENTS

| CN | 1975544 A | 6/2007 |
|---|---|---|
| CN | 100421019 C | 9/2008 |
| CN | 204188927 U | 3/2015 |
| CN | 105446041 A | 3/2016 |
| CN | 105655289 A | 6/2016 |

(Continued)

OTHER PUBLICATIONS

First Office Action for Chinese Patent Application No. 201710064612.0 dated Jun. 5, 2019.
(Continued)

*Primary Examiner* — Igwe U Anya
(74) *Attorney, Agent, or Firm* — Calfee, Halter & Griswold LLP

(57) ABSTRACT

An array substrate and a method of manufacturing the same are provided. The method of manufacturing an array substrate includes: forming a black matrix and an organic insulating pattern on a base substrate with a thin film transistor formed thereon, wherein the black matrix and the organic material pattern are formed by using an identical mask.

13 Claims, 4 Drawing Sheets

(51) Int. Cl.
*G02F 1/1362* (2006.01)
*G02F 1/1368* (2006.01)
*H01L 29/66* (2006.01)
*H01L 29/786* (2006.01)
*G03F 7/00* (2006.01)

(52) U.S. Cl.
CPC .. *G02F 1/136209* (2013.01); *G02F 1/136227* (2013.01); *G03F 7/0035* (2013.01); *G02F 1/136222* (2021.01); *G02F 2202/104* (2013.01); *H01L 29/66765* (2013.01); *H01L 29/78678* (2013.01)

(58) Field of Classification Search
USPC .......................................................... 257/72
See application file for complete search history.

(56) References Cited

FOREIGN PATENT DOCUMENTS

| | | |
|---|---|---|
| CN | 205334018 U | 6/2016 |
| CN | 107045237 A | 8/2017 |
| JP | 2008053698 A | 3/2008 |
| JP | 2013025148 A | 2/2013 |
| KR | 10-2006-0012804 A | 2/2006 |

OTHER PUBLICATIONS

Second Office Action for Chinese Patent Application No. 201710064612.0 dated Sep. 29, 2019.
International Search Report to corresponding PCT application No. PCT/CN2017/101906, dated Dec. 21, 2017.

* cited by examiner

ARRAY SUBSTRATE AND METHOD OF MANUFACTURING THE SAME

CROSS REFERENCE

The present application is based upon International Application No. PCT/CN2017/101906, filed on Sep. 15, 2017, which claims the priority of Chinese Patent Application No. 201710064612.0, titled "Array substrate and method of manufacturing the same", and filed on Feb. 4, 2017, and the entire contents thereof are incorporated herein by reference.

TECHNICAL FIELD

The present disclosure relates to the field of display technology, and in particular, to an array substrate and a method of manufacturing the same.

BACKGROUND

In a liquid crystal display device (LCD), a display panel mainly includes a thin film transistor array substrate (TFT), a color filter (CF) substrate, and a liquid crystal layer (LC) disposed between the two substrates. Its operating principle is that the rotation of liquid crystal molecules of the liquid crystal layer is controlled by applying a driving voltage between the two substrates, to refract light of a backlight module to produce an image.

The COA (color filter on array) technology is an integrated technology for forming a color filter layer directly on an array substrate, which may effectively solve problems such as light leakage caused by the alignment deviation in the cell assembly process of the liquid crystal display device, and may significantly increase an aperture ratio of the display.

It should be noted that, information disclosed in the above background portion is provided only for better understanding of the background of the present disclosure, and thus it may contain information that does not form the prior art known by those ordinary skilled in the art.

SUMMARY

According to one aspect of the present disclosure, there is provided a method of manufacturing an array substrate, including: forming a black matrix and an organic insulating pattern on a base substrate with a thin film transistor formed thereon, wherein the black matrix and the organic material pattern are formed by using an identical mask.

In one embodiment, the step of forming the black matrix and the organic material pattern by using an identical mask may include: forming a transparent photosensitive material layer having a predetermined thickness, and exposing and developing the transparent photosensitive material layer by using a grayscale mask, to form a first intermediate pattern; forming a black photosensitive material layer having a planar surface on the first intermediate pattern, and exposing and developing the black photosensitive material layer by using the grayscale mask, to form a second intermediate pattern; and processing the first intermediate pattern and the second intermediate pattern by an ashing process, to form the black matrix and the organic material pattern.

In one embodiment, the step of forming the first intermediate pattern may include: exposing and developing the transparent photosensitive material layer by using the grayscale mask, to form a completely reserved region of the transparent photosensitive material layer, a first partially reserved region of the transparent photosensitive material layer, a second partially reserved region of the transparent photosensitive material layer and a completely removed region of the transparent photosensitive material layer, wherein the first intermediate pattern includes the completely reserved region of the transparent photosensitive material layer, the first partially reserved region of the transparent photosensitive material layer and the second partially reserved region of the transparent photosensitive material layer.

In one embodiment, the step of forming the second intermediate pattern may include: exposing and developing the black photosensitive material layer by using the grayscale mask, to form a completely reserved region of the black photosensitive material layer, a first partially reserved region of the black photosensitive material layer, a second partially reserved region of the black photosensitive material layer and a completely removed region of the black photosensitive material layer, wherein the second intermediate pattern includes the completely reserved region of the black photosensitive material layer, the first partially reserved region of the black photosensitive material layer and the second partially reserved region of the black photosensitive material layer.

In one embodiment, an orthographic projection of a completely reserved region of the transparent photosensitive material layer of the first intermediate pattern on the base substrate does not coincide with the an orthogonal projection of a completely reserved region of the black photosensitive material layer of the second intermediate pattern on the base substrate, an orthographic projection of a first partially reserved region of the transparent photosensitive material layer of the first intermediate pattern on the base substrate coincides with an orthogonal projection of a second partially reserved region of the black photosensitive material layer of the second intermediate pattern on the base substrate, and an orthographic projection of a second partially reserved region of the transparent photosensitive material layer of the first intermediate pattern on the base substrate coincides with an orthographic projection of a first partially reserved region of the black photosensitive material layer of the second intermediate pattern on the base substrate.

In one embodiment, the step of processing the first intermediate pattern and the second intermediate pattern by an ashing process may include: completely removing the first partially reserved region of the black photosensitive material layer of the second intermediate pattern to form the organic material pattern, and partially removing the completely reserved region of the black photosensitive material layer of the second intermediate pattern to form the black matrix; and completely removing the completely reserved region of the transparent photosensitive material layer of the first intermediate pattern, completely removing the first partially reserved region of the transparent photosensitive material layer of the first intermediate pattern and the second partially reserved region of the black photosensitive material layer of the second intermediate pattern, to form a via hole between black matrix and the organic material pattern.

In one embodiment, the transparent photosensitive material layer may be a positive photosensitive material and the black photosensitive material layer may be a negative photosensitive material.

In one embodiment, the transparent photosensitive material layer may be a negative photosensitive material and the black photosensitive material layer may be a positive photosensitive material.

In one embodiment, prior to the forming a black matrix and an organic insulating pattern on a base substrate, the method may further include: forming a thin film transistor, and forming a passivation layer and a color resist layer; and after the forming a black matrix and an organic insulating pattern on a base substrate, the method further includes forming a pixel electrode.

In one embodiment, after the forming a black matrix and an organic insulating pattern on a base substrate, the method may further include forming a pixel electrode, and the pixel electrode is electrically connected to a drain electrode of the thin film transistor through the via hole.

According to another aspect of the present disclosure, there is provided an array substrate, including a base substrate, a thin film transistor formed on the base substrate, and a black matrix and an organic insulating pattern formed on the base substrate including the thin film transistor, wherein the black matrix and the organic material pattern are provided on an identical layer.

It is to be understood that both the foregoing general description and the following detailed description are exemplary and explanatory only and are not restrictive of the disclosure, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

The accompanying drawings, which are included to provide a further understanding of the present disclosure and are incorporated in this application and constitute a part of this application, illustrate embodiments of the present disclosure and together with the description serve to explain the principle of the present disclosure. In the drawing.

DETAILED DESCRIPTION

It will be understood that when an element or layer is referred to as being "on" or "connected to" another element or layer, the element or layer may be directly on another element or layer, or may be directly connected or directly combined to another element or layer, or there may also be intervening elements or intermediate layers. In contrast, when an element is referred to as being "directly on" or "directly connected to" another element or layer, there is no intervening element or layer. The same reference number always indicates the same element. As used herein, the term "and/or" includes any combination and all combinations of one or more of the associated listed items.

For ease of description, spatially relative terms such as "lower", "above", "on", "below" etc. may be used herein to describe the relationship between one element or feature and other elements or features as shown in the figures. It will be understood that the spatially relative terms are intended to encompass different orientations of the device in use or in operation in addition to the orientation depicted in the figures.

As used herein, the singular forms "a (an)" and "the (this)" are intended to include the plural forms as well, unless the context clearly indicates otherwise. It will also be understood that, when the terms "including" and/or "including" are used in this specification, the existence of the described features, entireties, steps, operations, elements and/or components is indicated, but the presence or additional one or more of other features, entireties, steps, operations, elements, components and/or groups thereof is not excluded.

Hereinafter, the present disclosure will be explained in detail with reference to the accompanying drawings.

Figure 1:
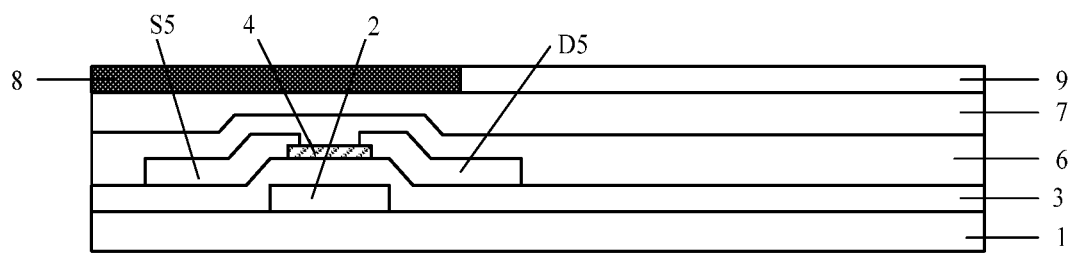
FIG. 1 is a schematic cross sectional view illustrating an array substrate according to an embodiment of the present disclosure.

FIG. 1 is a schematic cross sectional view illustrating an array substrate according to an embodiment of the present disclosure.

Referring to FIG. 1, an array substrate according to an embodiment of the present disclosure may include a base substrate 1, a thin film transistor formed on the base substrate, and a black matrix 8 and an organic insulating pattern 9 formed on the base substrate 1 including the thin film transistor. In the embodiment, the black matrix 8 and the organic material pattern 9 are provided in the same layer.

Specifically, an array substrate according to an embodiment of the present disclosure may include: a base substrate 1; a gate pattern layer 2, formed on the base substrate 1; a gate insulating layer 3, formed on the base substrate 1 and covering the gate pattern layer 2; an active pattern layer 4, formed on the gate insulating layer 3 located on the gate pattern layer 2; a source electrode S5 and a drain electrode D5, contacting the active pattern layer 4 and partially covering the gate insulation layer 3 respectively; a passivation layer 6 and a color resist layer 7, formed sequentially on the base substrate 1 on which the source electrode S5 and the drain electrode D5 are formed; and a black matrix 8 and an organic material pattern 9, formed on the base substrate 1 on which the passivation layer 6 and the color resist layer 7 are formed.

A process of forming the black matrix 8 and the organic material pattern 9 will be described in detail below with reference to FIGS. 2 to 6.

In summary, a black matrix 8 and an organic insulating pattern 9 are formed on a base substrate on which a thin film transistor is formed. In the embodiment, the black matrix 8 and the organic material pattern 9 are formed by using the same mask. The process of forming the black matrix 8 and the organic material pattern 9 will be described below in more detail with reference to the drawings.

Figure 2:
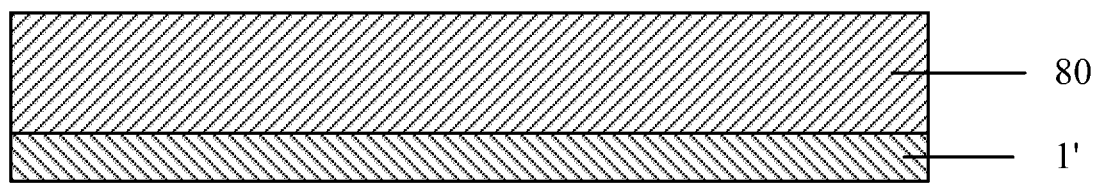
FIGS. 2 to 6 are schematic cross sectional views illustrating process steps of forming a black matrix and an organic material pattern layer respectively, according to embodiments of the present disclosure.

Referring to FIG. 2, a transparent photosensitive material layer 80 having a predetermined thickness is formed on the formed array substrate 1' (i.e., the base substrate 1 formed with the thin film transistor). The transparent photosensitive material layer 80 may be an organic positive photoresist material and may have a thickness of, for example, 20000 Å.

Figure 3:
Figure 3:
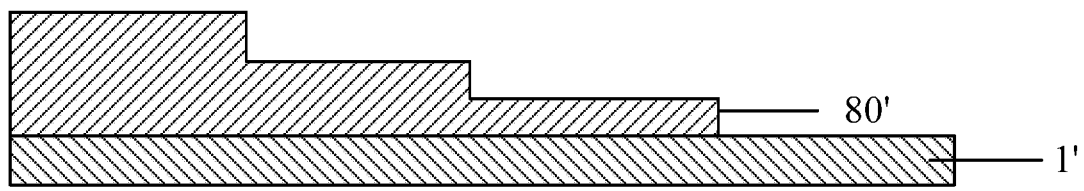

Referring to FIG. 3, the transparent photosensitive material layer 80 is exposed and developed by using a grayscale mask 16, to form a first intermediate pattern 80'. In the embodiment, the grayscale mask 16 includes four regions A1 to A4 having different light transmittances from each other. Specifically, the regions A1 and A2 of the grayscale mask 16 correspond to the via hole H for connecting the pixel electrode and the active pattern layer 4 on the array substrate. The region A3 of the grayscale mask 16 corresponds to the organic material pattern 9 below the pixel electrode. The region A4 of the grayscale mask 16 corresponds to the black matrix 8 for shielding light above the gate line and the data line.

In the embodiment, the four regions A1 to A4 of the grayscale mask 16 have light transmittances of 0%, 30%, 60%, and 100% respectively. In this way, after exposing and developing, the formed organic material pattern 80' has four regions having different thicknesses from each other. In the embodiment, the thicknesses of the four regions are 20000 Å, 14000 Å, 8000 Å, and 0 Å respectively from left to right. However, the value of the light transmittance is only an example, and these regions may have light transmittances of other values different from each other as needed.

Specifically, the step of forming the first intermediate pattern 80' includes: exposing and developing the transparent photosensitive material layer 80 by using the grayscale mask 16, to form a completely reserved region (corresponding to the region A1 of the grayscale mask 16) of the transparent photosensitive material layer 80, a first partially reserved region (corresponding to the region A2 of the grayscale mask 16) of the transparent photosensitive material layer 80, a second partially reserved region (corresponding to the region A3 of the grayscale mask 16) of the transparent photosensitive material layer 80 and a completely removed region (corresponding to the region A4 of the grayscale mask 16) of the transparent photosensitive material layer 80, wherein the first intermediate pattern 80' includes the completely reserved region of the transparent photosensitive material layer 80, the first partially reserved region of the transparent photosensitive material layer 80 and the second partially reserved region of the transparent photosensitive material layer 80.

Figure 4:
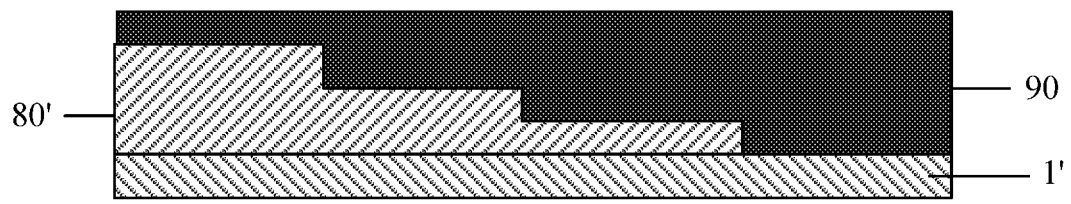

Referring to FIG. 4, a black photosensitive material layer 90 having a planar surface is formed on the first intermediate pattern 80'. The black photosensitive material layer 90 may be a black negative photoresist material and may have a thickness of, for example, 30000 Å.

Figure 5:
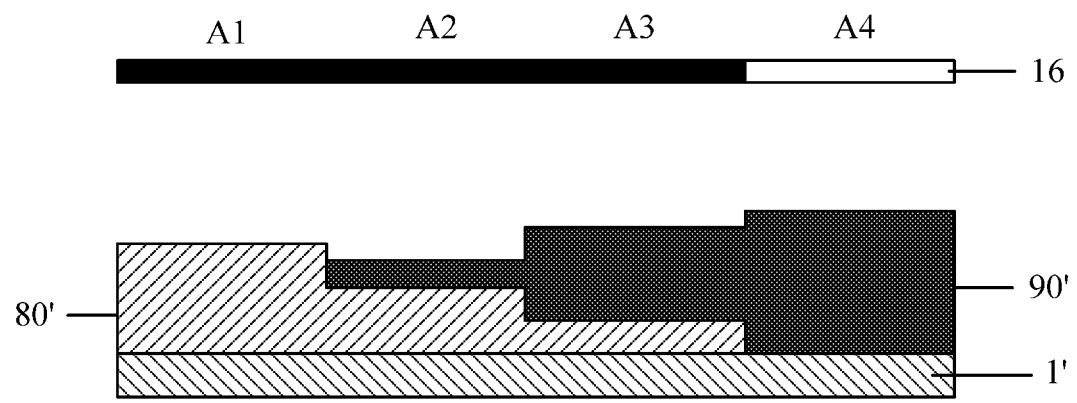

Referring to FIG. 5, the black photosensitive material layer 90 is exposed and developed by using the above grayscale mask 16, thereby forming a second intermediate pattern 90'. As shown in the figure, after exposing and developing, a region of the second intermediate pattern 90' corresponding to the region A1 of the grayscale mask 16 is removed, so that the remaining second intermediate pattern 90' has three regions having different thicknesses corresponding to the regions A2 to A4 of the grayscale mask.

Specifically, the step of forming the second intermediate pattern 90' includes: exposing and developing the black photosensitive material layer by using the grayscale mask 16, to form a completely reserved region (corresponding to the region A4 of the grayscale mask 16) of the black photosensitive material layer 90, a first partially reserved region (corresponding to the region A3 of the grayscale mask 16) of the black photosensitive material layer 90, a second partially reserved region (corresponding to the region A2 of the grayscale mask 16) of the black photosensitive material layer 90 and a completely removed region (corresponding to the region A1 of the grayscale mask 16) of the black photosensitive material layer 90, wherein the second intermediate pattern 90' includes the completely reserved region of the black photosensitive material layer 90, the first partially reserved region of the black photosensitive material layer 90 and the second partially reserved region of the black photosensitive material layer 90.

As shown in the figure, an orthographic projection of a completely reserved region of the transparent photosensitive material layer 80 of the first intermediate pattern 80' on the base substrate does not coincide with the an orthogonal projection of a completely reserved region of the black photosensitive material layer 90 of the second intermediate pattern 90' on the base substrate, an orthographic projection of a first partially reserved region of the transparent photosensitive material layer 80 of the first intermediate pattern 80' on the base substrate coincides with an orthogonal projection of a second partially reserved region of the black photosensitive material layer 90 of the second intermediate pattern 90' on the base substrate, and an orthographic projection of a second partially reserved region of the transparent photosensitive material layer 80 of the first intermediate pattern 80' on the base substrate coincides with an orthographic projection of a first partially reserved region of the black photosensitive material layer 90 of the second intermediate pattern 90' on the base substrate.

Figure 6:
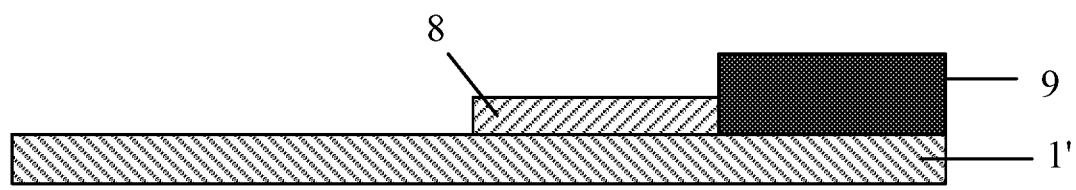

Then, referring to FIG. 6, the first intermediate pattern 80' and the second intermediate pattern 90' are processed by an ashing process, thereby forming the black matrix 8 and the organic material pattern 9.

The step of processing the first intermediate pattern 80' and the second intermediate pattern 90' by an ashing process includes: completely removing the first partially reserved region of the black photosensitive material layer of the second intermediate pattern 90' to form the organic material pattern 9, and partially removing the completely reserved region of the black photosensitive material layer of the second intermediate pattern 90' to form the black matrix 8; and completely removing the completely reserved region of the transparent photosensitive material layer 80 of the first intermediate pattern 80', completely removing the first partially reserved region of the transparent photosensitive material layer 80 of the first intermediate pattern 80' and the second partially reserved region of the black photosensitive material layer 90 of the second intermediate pattern 90', to form a via hole H between black matrix 8 and the organic material pattern 9.

In an embodiment, the transparent photosensitive material layer is a positive photosensitive material and the black photosensitive material layer is a negative photosensitive material. Alternatively, the transparent photosensitive material layer is a negative photosensitive material and the black photosensitive material layer is a positive photosensitive material.

As can be seen from the above embodiments, in the present disclosure, an organic material pattern layer formed of an organic material is formed between a pixel electrode and a gate line or a data line. The introduction of the organic material pattern layer increases a spacing between a pixel electrode and a gate line or a data line, thereby reducing a parasitic capacitance between the pixel electrode and the gate line or the data line, thereby further reducing the power consumption of a display panel of the liquid crystal display.

In addition, since the black matrix and the organic material pattern layer may be formed by using an identical mask, the manufacturing cost is reduced.

Referring to FIGS. 13 to 16, an array substrate according to an embodiment of the present disclosure may further include: a pixel electrode 10, formed on a base substrate 1 on which a black matrix 8 and an organic material pattern 9 are formed, and electrically connected to a drain electrode D5 through a via hole H; a planarization layer 11, formed on the base substrate 1 on which the pixel electrode 10 is formed; and a common electrode 12, formed on the planarization layer 11.

In the embodiment of the present disclosure, specifically, a color resist layer 7 is formed between the passivation layer 6 and the organic material pattern 9. In addition, the color resist layer 7 refers to a red/green/blue primary color layer covering the passivation layer 6.

An organic material pattern 9 formed of an organic material is formed between a pixel electrode 10 and a gate line or a data line (not shown). The introduction of the organic material pattern 9 increases a spacing between a pixel electrode 10 and a gate line or a data line, thereby reducing a parasitic capacitance between the pixel electrode 10 and the gate line or the data line, thereby further reducing the power consumption of a display panel of the liquid crystal display.

The process steps of a method of manufacturing a thin film transistor of an array substrate according to embodiments of the present disclosure will be described in detail below with reference to FIGS. 7 to 15.

FIGS. 7 to 15 are schematic cross sectional views illustrating process steps of a method of manufacturing a thin film transistor of an array substrate respectively, according to embodiments of the present disclosure.

Figure 7:
FIGS. 7 to 15 are schematic cross sectional views illustrating process steps of a method of manufacturing a thin film transistor of an array substrate respectively, according to embodiments of the present disclosure.

First, referring to FIG. 7, a gate pattern layer 2 is formed on a base substrate 1. The base substrate 1 may be an inorganic substrate or an organic substrate, and may be transparent, opaque or translucent. Specifically, the base substrate 1 may be a transparent substrate selected from a glass substrate, a quartz substrate, a transparent resin substrate, or the like, which has a certain firmness and is light-transmitting.

The gate pattern layer 2 may be formed of a general-purpose electrode material (for example, a metal, an alloy, a conductive metal oxide, a conductive metal nitride, or the like). For example, the gate pattern layer 2 may be formed of metal such as titanium (Ti), platinum (Pt), ruthenium (Ru), gold (Au), silver (Ag), molybdenum (Mo), aluminum (Al), tungsten (W), copper (Cu), neodymium (Nd), chromium (Cr), tantalum (Ta), or an alloy including the above metal, or a conductive oxide such as In—Zn—O (Indium Zinc Oxide) (IZO), Al—Zn—O (Aluminum Zinc Oxide) (AZO), In—Sn—O (Indium Tin Oxide) (ITO), Ga—Zn—O (Gallium Zinc Oxide) (GZO) or Zn—Sn—O (Zinc Tin Oxide) (ZTO) or the like. In addition, the gate pattern layer 2 may have a single-layer structure or a multi-layer structure.

For example, a gate material layer may be deposited on, for example, a glass substrate, and then a gate material layer is sequentially subjected to adhesive coating (e.g., positive photoresist), exposing, developing, etching, and lift-off to obtain a gate pattern layer 2 having a desired pattern.

Figure 8:
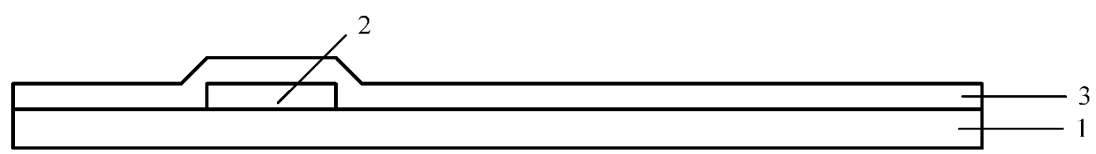
Figure 9:
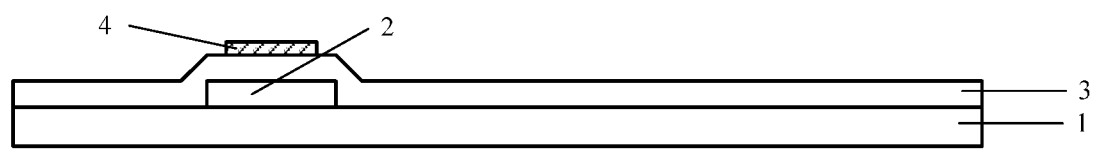

Referring to FIGS. 8 and 9, a gate insulating layer 3 is formed on a base substrate 1 on which a gate pattern layer 2 is formed, and an active pattern layer 4 is formed on the gate insulating layer 3 located on the gate pattern layer 2.

The gate insulating layer 3 may be formed of $SiN_x$ or $SiO_2$.

Specifically, the gate insulating layer 3 covering the gate pattern layer 2 may be formed on the base substrate 1. The gate insulating layer 3 may include a silicon oxide ($SiO_2$) layer, a silicon oxynitride ($SiO_xN_y$) layer, or a silicon nitride ($Si_3N_4$) layer. In addition, the gate insulating layer 3 may have a structure in which at least two layers of the silicon oxide layer, the silicon oxynitride layer or the silicon nitride layer are stacked. For example, the gate insulating layer 3 may have a structure in which the silicon nitride layer and the silicon oxide layer are stacked. In this case, the silicon nitride layer and the silicon oxide layer may be sequentially disposed on the gate pattern layer 2. Also, the gate insulating layer 3 may be formed of an organic resin material. In addition, the gate insulating layer 3 having a certain thickness may be formed according to actual needs. In the present disclosure, the thickness of the gate pattern layer 3 is not particularly limited.

For example, an organic resin material having a thickness may be formed on the base substrate 1 on which the gate pattern layer 2 is formed through various processes such as coating, sputtering, thermal evaporation, chemical vapor deposition, or the like, to form the gate insulating layer 3. If necessary, the organic resin material may be patterned, to form the gate insulating layer 3 having a predetermined pattern.

For example, a polysilicon layer having a certain thickness may be deposited on the base substrate 1 on which the gate insulating layer 3 is formed, and then the polysilicon layer may be processed to form the active pattern layer 4. For example, the adhesive coating (e.g., a positive photoresist), exposing, developing, etching, and lift-off may be sequentially performed on the polysilicon, to obtain an active pattern layer 4 having a desired pattern.

Figure 10:
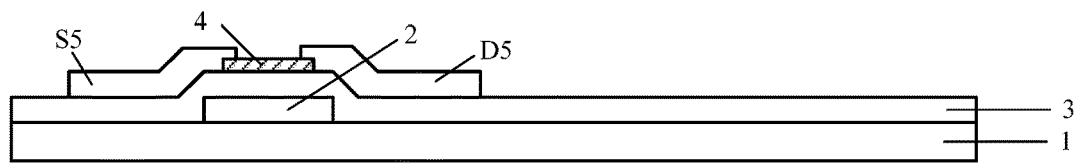

Then, referring to FIG. 10, the source electrode S5 and the drain electrode D5 may be formed on the base substrate 1 on which the active pattern layer 4 is formed. The source electrode S5 and the drain electrode D5 that respectively contact the first region and the second region (for example, two ends) of the active pattern layer 4 may be formed on the gate insulating layer 3. Each of the source electrode S5 and the drain electrode D5 may have a single-layer structure or a multi-layer structure. The material of the source electrode S5 and the drain electrode D5 may be the same as or similar to that of the gate pattern layer 2. Each of the source electrode S5 and the drain electrode D5 may be formed of the material same as that of the gate pattern layer 2, or may be formed of the material different from that of the gate pattern layer 2. For example, each of the source electrode S5 and/or the drain electrode D5 may be formed of a metal such as Ti, Pt, Ru, Au, Ag, Mo, Al, W, Cu, Nd, Cr, Ta, or an alloy including the above metals, or a conductive oxide such as IZO, AZO, ITO, GZO, or ZTO, or a compound including a conductive oxide.

For example, a material layer for the source electrode S5 and the drain electrode D5 may be deposited on the base substrate 1 on which the active pattern layer 4 is formed, and then the adhesive coating (e.g., a positive photoresist), exposing, developing, etching, and lift-off may be sequentially formed on the material layer, thus obtaining a source electrode S5 and a drain electrode D5 having a desired pattern. Through the above steps, the thin film transistor of the array substrate is formed.

Figure 11:
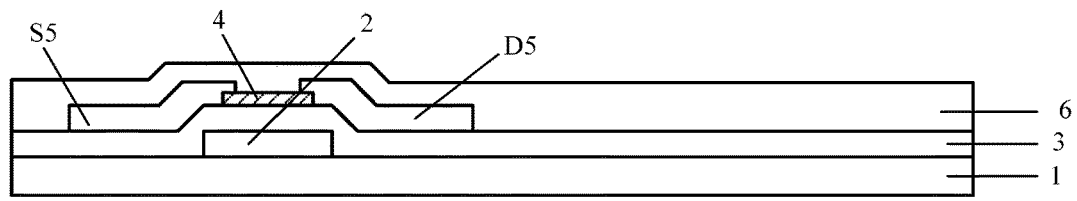
Figure 12:
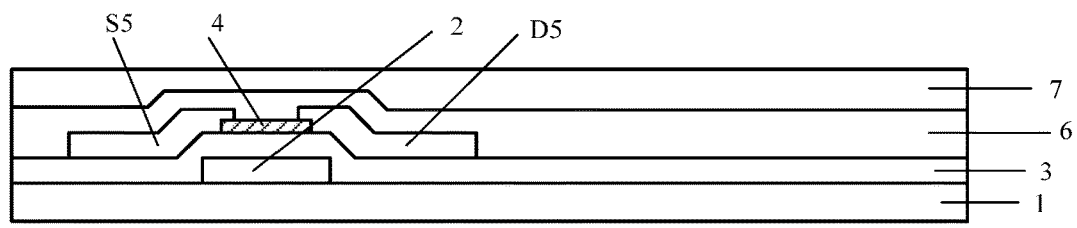

Then, referring to FIGS. 11 and 12, a passivation layer 6 and a color resist layer 7 are sequentially formed on the base substrate 1 on which the source electrode S5 and the drain electrode D5 are formed.

A passivation layer 6 covering the active pattern layer 4, the source electrode S5 and the drain electrode D5 may be provided on the gate insulating layer 3. The passivation layer 6 may be a silicon oxide layer, a silicon oxynitride layer, a silicon nitride layer, or an organic layer, or may have a structure in which at least two of the silicon oxide layer, the silicon oxynitride layer, the silicon nitride layer or the organic layer are stacked. For example, the passivation layer 6 may have a single-layer structure formed of silicon oxide or silicon nitride, or a multi-layer structure including a silicon oxide layer and a silicon nitride layer disposed on the silicon oxide layer. In addition, the passivation layer 6 may have a multi-layer structure including two or more layers. In this case, the passivation layer 6 may include a silicon oxide layer, a silicon oxynitride layer and a silicon nitride layer that are sequentially stacked. In the present disclosure, ranges of the thicknesses of the source electrode S5, the drain electrode D5 and the passivation layer 6 are not limited, and may be changed as needed.

A color resist layer 7 may be formed on the passivation layer 6. Specifically, the color resist layer 7 covering the entire passivation layer 6 may be formed on the base substrate 1 on which the passivation layer 6 is formed, that is, red/green/blue color filter blocks are formed. The color resist layer 7 may be formed by adhesive coating, exposing, and developing.

Figure 13:
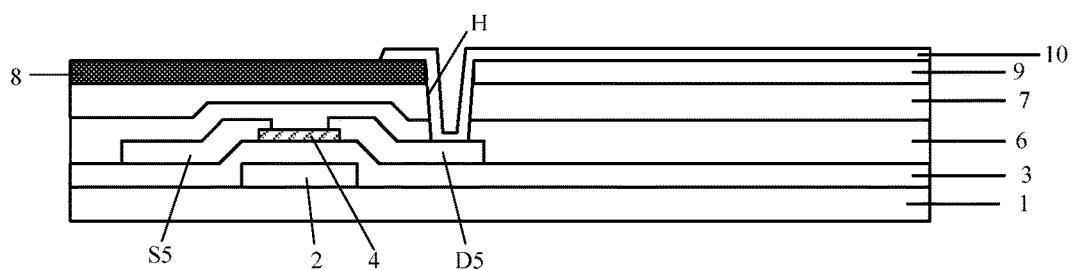

Then referring to FIG. 13, a black matrix 8 and an organic material pattern 9 are formed on a base substrate on which a passivation layer 6 and a color resist layer 7 are formed, wherein the organic material pattern 9 and the black matrix 8 are provided in the same layer. The organic material pattern 9, the black matrix 8, and the via hole H between the organic material pattern 9 and the black matrix 8 may be formed through the above-described processes.

In the present disclosure, the black matrix 8 and the organic material pattern 9 is formed by using the same mask.

A pixel electrode 10 is formed on the base substrate 1 on which the black matrix 8 and the organic material pattern 9 are formed, and the pixel electrode 10 is electrically connected to the drain electrode D5 through the via hole H. A metal oxide layer (for example, an ITO layer) may be deposited first, and then a process of adhesive coating (positive photoresist), exposing, developing, ashing, etching, and lift-off may be performed, thereby forming the pixel electrode 10 having a predetermined pattern.

Figure 14:
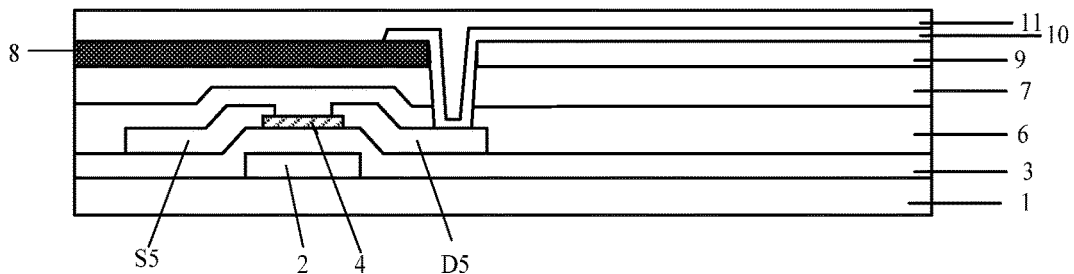

Referring to FIG. 14, a planarization layer 11 is formed on a base substrate 1 on which a pixel electrode 10 is formed. One or more materials of the acrylic resin, epoxy resin, phenol resin, polyamide resin, polyimide resin, unsaturated polyester resin, polyphenylene ether resin, polyphenylene sulfide resin, and benzocyclobutene (BCB) may be used to form the planarization layer 11.

Figure 15:
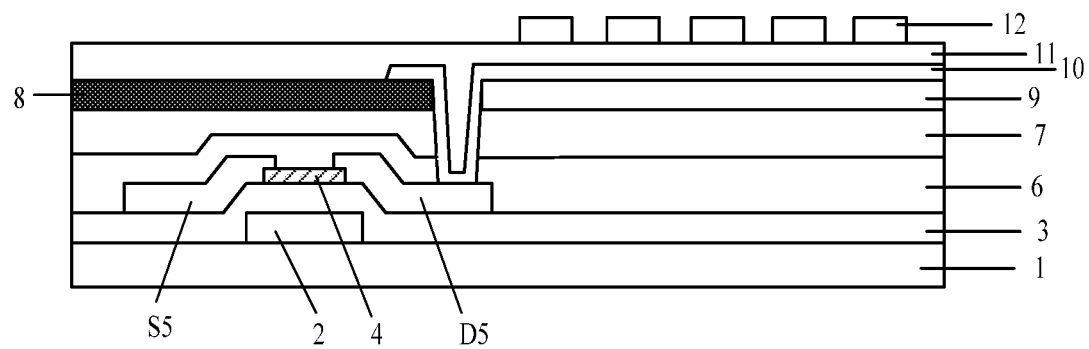

Referring to FIG. 15, a common electrode 12 is formed on the planarization layer 11. Similarly, the metal oxide layer (ITO layer) may be deposited first, and then a process of adhesive coating (positive photoresist), exposing, developing, ashing, etching, and lift-off may be performed, thereby forming the common electrode 12.

Figure 16:
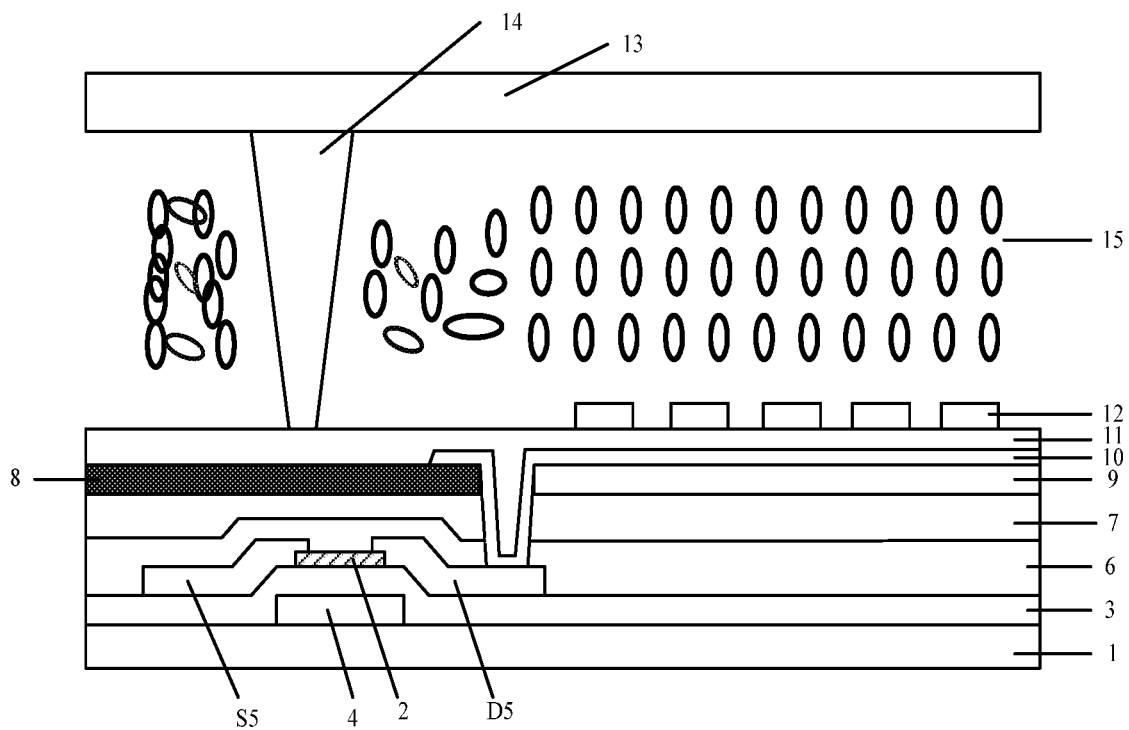
FIG. 16 is a schematic cross sectional view illustrating a display panel according to an embodiment of the present disclosure.

Referring to FIG. 16, the array substrate manufactured through the above steps is combined with another substrate (which may be a substrate described above, such as the glass substrate), a spacer 13 is disposed therebetween and the liquid crystal 15 is injected therebetween, thereby forming a display panel for, for example, a liquid crystal display.

The present disclosure further provides a display panel including the array substrate described above.

In addition, the present disclosure further provides a method of manufacturing a display panel, the method including the array substrate manufactured according to the method described above. In addition, the method of manufacturing a display panel further includes: combining the manufactured array substrate with another substrate, with a spacer disposed therebetween; and forming a liquid crystal layer between the array substrate and said another substrate.

The foregoing description of specific exemplary embodiments of the present disclosure has been given for with respect to the accompanying drawings. These exemplary embodiments are not intended to be exhaustive or to limit the present disclosure to the precise forms disclosed, and obviously many modifications and variations will occur to those skilled in the art in light of the above teachings. Therefore, the scope of the present disclosure is not intended to be limited to the foregoing embodiments but is intended to be limited by the claims and their equivalents.

What is claimed is:

1. A method of manufacturing an array substrate, comprising:
    forming a black matrix and an organic insulating pattern on a base substrate with a thin film transistor formed thereon, wherein the black matrix and the organic material pattern are formed by using an identical mask,
    wherein the step of forming the black matrix and the organic material pattern by using an identical mask comprises:
    forming a transparent photosensitive material layer having a predetermined thickness, and exposing and developing the transparent photosensitive material layer by using a grayscale mask, to form a first intermediate pattern;
    forming a black photosensitive material layer having a planar surface on the first intermediate pattern, and exposing and developing the black photosensitive material layer by using the grayscale mask, to form a second intermediate pattern; and
    processing the first intermediate pattern and the second intermediate pattern by an ashing process, to form the black matrix and the organic material pattern.

2. The method of manufacturing an array substrate according to claim 1, wherein the step of forming the first intermediate pattern comprises:
    exposing and developing the transparent photosensitive material layer by using the grayscale mask, to form a completely reserved region of the transparent photosensitive material layer, a first partially reserved region of the transparent photosensitive material layer, a second partially reserved region of the transparent photosensitive material layer and a completely removed region of the transparent photosensitive material layer, wherein the first intermediate pattern comprises the completely reserved region of the transparent photosensitive material layer, the first partially reserved region of the transparent photosensitive material layer and the second partially reserved region of the transparent photosensitive material layer.

3. The method of manufacturing an array substrate according to claim 2, wherein an orthographic projection of a completely reserved region of the transparent photosensitive material layer of the first intermediate pattern on the base substrate does not coincide with the an orthogonal projection of a completely reserved region of the black photosensitive material layer of the second intermediate pattern on the base substrate, an orthographic projection of a first partially reserved region of the transparent photosensitive material layer of the first intermediate pattern on the base substrate coincides with an orthogonal projection of a second partially reserved region of the black photosensitive material layer of the second intermediate pattern on the base substrate, and an orthographic projection of a second partially reserved region of the transparent photosensitive material layer of the first intermediate pattern on the base substrate coincides with an orthographic projection of a first partially reserved region of the black photosensitive material layer of the second intermediate pattern on the base substrate.

4. The method of manufacturing an array substrate according to claim 3, wherein the step of processing the first intermediate pattern and the second intermediate pattern by an ashing process comprises:

completely removing the first partially reserved region of the black photosensitive material layer of the second intermediate pattern to form the organic material pattern, and partially removing the completely reserved region of the black photosensitive material layer of the second intermediate pattern to form the black matrix; and completely removing the completely reserved region of the transparent photosensitive material layer of the first intermediate pattern, completely removing the first partially reserved region of the transparent photosensitive material layer of the first intermediate pattern and the second partially reserved region of the black photosensitive material layer of the second intermediate pattern, to form a via hole between black matrix and the organic material pattern.

5. The method of manufacturing an array substrate according to claim 1, wherein the step of forming the second intermediate pattern comprises:

exposing and developing the black photosensitive material layer by using the grayscale mask, to form a completely reserved region of the black photosensitive material layer, a first partially reserved region of the black photosensitive material layer, a second partially reserved region of the black photosensitive material layer and a completely removed region of the black photosensitive material layer, wherein the second intermediate pattern comprises the completely reserved region of the black photosensitive material layer, the first partially reserved region of the black photosensitive material layer and the second partially reserved region of the black photosensitive material layer.

6. The method of manufacturing an array substrate according to claim 5, wherein an orthographic projection of a completely reserved region of the transparent photosensitive material layer of the first intermediate pattern on the base substrate does not coincide with the an orthogonal projection of a completely reserved region of the black photosensitive material layer of the second intermediate pattern on the base substrate, an orthographic projection of a first partially reserved region of the transparent photosensitive material layer of the first intermediate pattern on the base substrate coincides with an orthogonal projection of a second partially reserved region of the black photosensitive material layer of the second intermediate pattern on the base substrate, and an orthographic projection of a second partially reserved region of the transparent photosensitive material layer of the first intermediate pattern on the base substrate coincides with an orthographic projection of a first partially reserved region of the black photosensitive material layer of the second intermediate pattern on the base substrate.

7. The method of manufacturing an array substrate according to claim 6, wherein the step of processing the first intermediate pattern and the second intermediate pattern by an ashing process comprises:

completely removing the first partially reserved region of the black photosensitive material layer of the second intermediate pattern to form the organic material pattern, and partially removing the completely reserved region of the black photosensitive material layer of the second intermediate pattern to form the black matrix; and completely removing the completely reserved region of the transparent photosensitive material layer of the first intermediate pattern, completely removing the first partially reserved region of the transparent photosensitive material layer of the first intermediate pattern and the second partially reserved region of the black photosensitive material layer of the second intermediate pattern, to form a via hole between black matrix and the organic material pattern.

8. The method of manufacturing an array substrate according to claim 1, wherein an orthographic projection of a completely reserved region of the transparent photosensitive material layer of the first intermediate pattern on the base substrate does not coincide with the an orthogonal projection of a completely reserved region of the black photosensitive material layer of the second intermediate pattern on the base substrate, an orthographic projection of a first partially reserved region of the transparent photosensitive material layer of the first intermediate pattern on the base substrate coincides with an orthogonal projection of a second partially reserved region of the black photosensitive material layer of the second intermediate pattern on the base substrate, and an orthographic projection of a second partially reserved region of the transparent photosensitive material layer of the first intermediate pattern on the base substrate coincides with an orthographic projection of a first partially reserved region of the black photosensitive material layer of the second intermediate pattern on the base substrate.

9. The method of manufacturing an array substrate according to claim 8, wherein the step of processing the first intermediate pattern and the second intermediate pattern by an ashing process comprises:

completely removing the first partially reserved region of the black photosensitive material layer of the second intermediate pattern to form the organic material pattern, and partially removing the completely reserved region of the black photosensitive material layer of the second intermediate pattern to form the black matrix; and completely removing the completely reserved region of the transparent photosensitive material layer of the first intermediate pattern, completely removing the first partially reserved region of the transparent photosensitive material layer of the first intermediate pattern and the second partially reserved region of the black photosensitive material layer of the second intermediate pattern, to form a via hole between black matrix and the organic material pattern.

10. The method of manufacturing an array substrate according to claim 9, wherein after the forming a black matrix and an organic insulating pattern on a base substrate, the method further comprises forming a pixel electrode, and the pixel electrode is electrically connected to a drain electrode of the thin film transistor through the via hole.

11. The method of manufacturing an array substrate according to claim 1, wherein the transparent photosensitive material layer is a positive photosensitive material and the black photosensitive material layer is a negative photosensitive material.

12. The method of manufacturing an array substrate according to claim 1, wherein the transparent photosensitive material layer is a negative photosensitive material and the black photosensitive material layer is a positive photosensitive material.

13. The method of manufacturing an array substrate according to claim 1, wherein prior to the forming a black matrix and an organic insulating pattern on a base substrate, the method further comprises: forming a thin film transistor, and forming a passivation layer and a color resist layer; and after the forming a black matrix and an organic insulating pattern on a base substrate, the method further comprises forming a pixel electrode.

\* \* \* \* \*